(12) United States Patent
Zushi et al.

(10) Patent No.: US 8,921,998 B2
(45) Date of Patent: Dec. 30, 2014

(54) SEMICONDUCTOR MODULE

(75) Inventors: Yusuke Zushi, Nottingham (GB);
Yoshinori Murakami, Yokohama (JP);
Satoshi Tanimoto, Yokohama (JP);
Shinji Sato, Niiza (JP); Kohei Matsui,
Hino (JP)

(73) Assignees: Nissan Motor Co., Ltd., Yokohama (JP);
Sanken Electric Co., Ltd., Niiza (JP);
Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 14/236,236

(22) PCT Filed: Aug. 24, 2012

(86) PCT No.: PCT/JP2012/071398
§ 371 (c)(1),
(2), (4) Date: Jan. 30, 2014

(87) PCT Pub. No.: WO2013/027819
PCT Pub. Date: Feb. 28, 2013

(65) Prior Publication Data
US 2014/0159225 A1    Jun. 12, 2014

(30) Foreign Application Priority Data
Aug. 25, 2011    (JP) .................................. 2011-184019

(51) Int. Cl.
*H01L 23/10* (2006.01)
*H01L 23/34* (2006.01)
(Continued)

(52) U.S. Cl.
CPC ........ *H01L 23/5384* (2013.01); *H01L 23/3735* (2013.01); *H01L 2924/1306* (2013.01); *H01L 24/48* (2013.01); *H01L 24/49* (2013.01); *H01L 25/072* (2013.01); *H01L 2224/48132* (2013.01); *H01L 2224/48227* (2013.01); *H01L 2224/48235* (2013.01); *H01L 2224/49175* (2013.01);
(Continued)

(58) Field of Classification Search
CPC .................... H01L 23/3735; H01L 23/5384
USPC .................. 257/706, 713, 784, 723, E23.101
See application file for complete search history.

(56) References Cited

U.S. PATENT DOCUMENTS 5,606,487 A * 2/1997 Yasukawa et al. ............ 361/707
5,621,243 A * 4/1997 Baba et al. .................... 257/712

(Continued)

FOREIGN PATENT DOCUMENTS

JP    2000-31325 A    1/2000
JP    2005-20868 A    1/2005

(Continued)

*Primary Examiner* — Nitin Parekh
(74) *Attorney, Agent, or Firm* — Global IP Counselors, LLP

(57) ABSTRACT

A semiconductor module has a pair of semiconductor devices, a heat sink, a first electrode, an output electrode and a second electrode. The semiconductor devices are connected in series with each other and have first terminals that are electrically connected to a first power system and a second terminal that is electrically connected to a second power system. The first electrode is electrically connected both to one of the first terminal and to an electrode of one of the semiconductor devices. The output electrode is electrically connected both to the second terminal and to an electrode of the other of the semiconductor device. The second electrode is electrically connected to the other of the first terminals. The second electrode is connected to the heat sink via a first insulating member. The output electrode is connected to the second electrode via a second insulating member.

6 Claims, 10 Drawing Sheets

(51) Int. Cl.
   *H01L 23/538* (2006.01)
   *H01L 23/373* (2006.01)
   *H01L 23/00* (2006.01)
   *H01L 25/07* (2006.01)
   *H01L 23/498* (2006.01)
   *H01L 25/18* (2006.01)

(52) U.S. Cl.
   CPC .............. *H01L 2924/10272* (2013.01); *H01L 2924/1033* (2013.01); *H01L 2924/1203* (2013.01); *H01L 2924/1305* (2013.01); *H01L 2924/13055* (2013.01); *H01L 2924/13091* (2013.01); *H01L 2924/30105* (2013.01); *H01L 2224/48091* (2013.01); *H01L 2224/48472* (2013.01); *H01L 2224/49111* (2013.01); *H01L 2224/4846* (2013.01); *H01L 23/49811* (2013.01); *H01L 25/18* (2013.01); *H01L 2924/30107* (2013.01)
   USPC .......... 257/706; 257/713; 257/723; 257/784; 257/E23.101

(56) References Cited

U.S. PATENT DOCUMENTS

| | | | | |
|---|---|---|---|---|
| 5,747,875 | A  * | 5/1998 | Oshima | 257/687 |
| 5,767,573 | A  * | 6/1998 | Noda et al. | 257/675 |
| 6,747,300 | B2 * | 6/2004 | Nadd et al. | 257/288 |
| 7,763,974 | B2 * | 7/2010 | Takahashi et al. | 257/724 |
| 8,472,196 | B2 * | 6/2013 | Zeng et al. | 361/718 |
| 8,488,316 | B2 * | 7/2013 | Zeng et al. | 361/690 |
| 2003/0025195 | A1* | 2/2003 | Nakamura et al. | 257/706 |
| 2003/0025196 | A1* | 2/2003 | Nakamura et al. | 257/706 |
| 2004/0061221 | A1* | 4/2004 | Schaffer | 257/723 |
| 2005/0258550 | A1* | 11/2005 | Morita et al. | 257/784 |
| 2009/0057929 | A1* | 3/2009 | Sasaki et al. | 257/796 |

FOREIGN PATENT DOCUMENTS

| | | |
|---|---|---|
| JP | 3649259 B2 | 2/2005 |
| JP | 2005-217167 A | 8/2005 |
| JP | 2010-16947 A | 1/2010 |
| JP | 2012-15418 A | 1/2012 |
| JP | 2012-39825 A | 2/2012 |

* cited by examiner

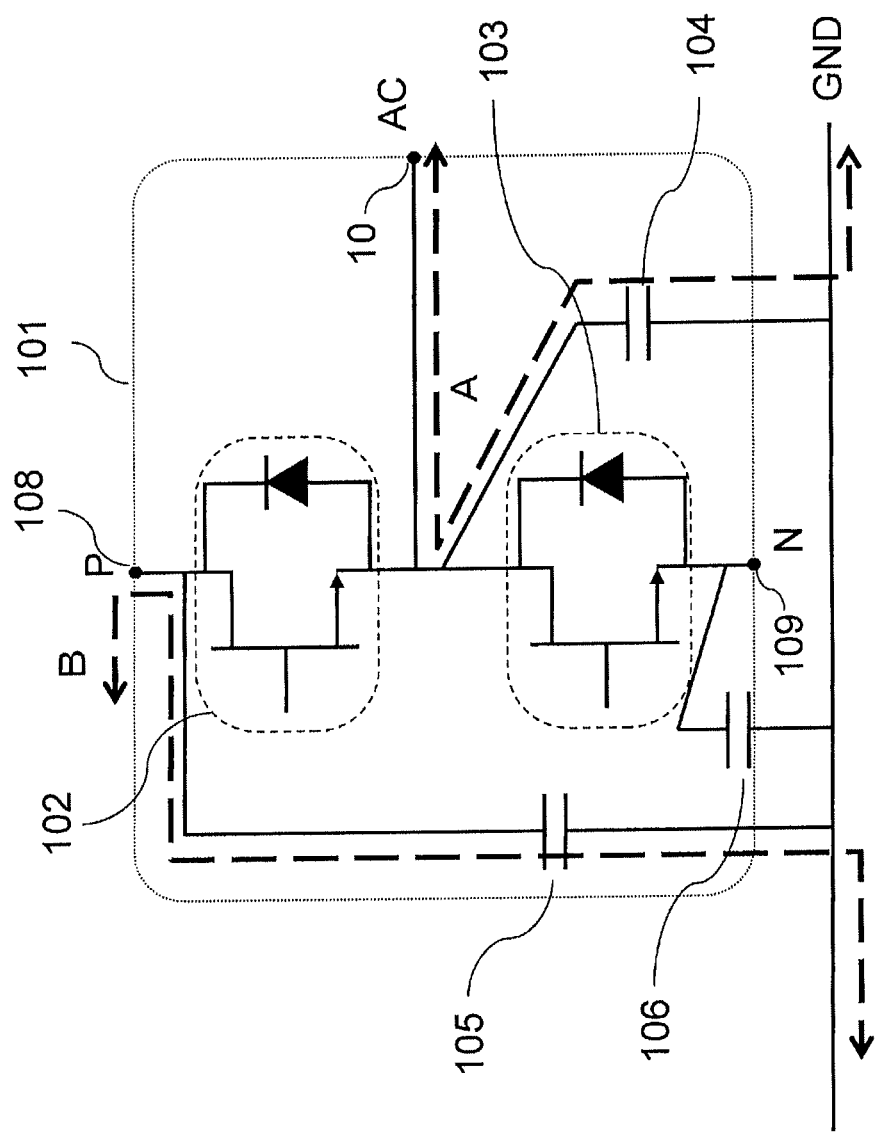

SEMICONDUCTOR MODULE

CROSS-REFERENCE TO RELATED APPLICATIONS

This application is a U.S. National stage application of International Application No. PCT/JP2012/071398, filed Aug. 24, 2012, which claims priority under to Japanese Patent Application No. 2011-184019 filed in Japan on Aug. 25, 2011.

BACKGROUND

1. Field of the Invention

The present invention relates to a semiconductor module.

2. Background Information

There is known an electric power conversion apparatus in which earth stray capacitance of the electric power conversion apparatus (inverter) is reduced by using, for example, ceramic as a material of a cooling fin (heat sink) so as to reduce leak current that is a possible cause of noise (Japanese Patent No. 3,649,259).

SUMMARY

With the configuration of the above-described conventional technology, earth stray capacitance of the electric power conversion apparatus can be reduced compared to a case in which the cooling fin is made of metal. However, since the thermal conductivity of ceramic is lower than the thermal conductivity of metal, there is fear that the electric power conversion apparatus cannot be sufficiently cooled.

An object of the present invention is to reduce earth stray capacitance of an electric power conversion apparatus and prevent the performance of cooling the electric power conversion apparatus from being deteriorated at the same time.

In order to achieve the above-described object, in the present invention, an output electrode is connected to a second electrode via an insulating member, and the second electrode is connected to a heat sink via another insulating member.

According to the present invention, the output electrode is grounded via the second electrode, and a circuit configuration in which the stray capacitance between the output electrode and the ground and the stray capacitance between the second electrode and the ground are connected in series is achieved. Therefore, common mode current can be reduced. Also, since the output electrode and the second electrode are connected with low resistance, the performance of cooling the electric power conversion apparatus can be prevented from being deteriorated at the same time.

BRIEF DESCRIPTION OF THE DRAWINGS

Referring now to the attached drawings which form a part of this original disclosure.

FIG. 2 is an electric circuit diagram for explaining common mode current.

DETAILED DESCRIPTION OF THE EMBODIMENTS

The present invention relates to a power module that constructs a switch part of an electric power converter using a wide-gap semiconductor device such as an SiC, and a heat sink for cooling this. Regarding such an electric power converter using a wide-gap semiconductor device, in order to take advantage of the characteristics of the device and downsize the device, it is required that the power supply voltage is made high and turning ON/OFF of the device is made high speed so as to reduce the loss.

However, the high voltage converter needs to be insulated from the ground (hereinafter, also referred to as GND). Therefore, there is a problem in that the amount of voltage change (dV/dt) per unit time will increase when the power supply voltage is made high and turning ON/OFF of the device is made high speed, resulting in increase of current that flows through stray capacitance in an insulating layer between the power module and the GND.

Current $I_{cm}$ flowing through this capacitance can be represented by $I_{cm}=C\times(dV/dt)$ using the capacitance C and dV/dt, and can be defined as common mode current leaking from the high voltage system to the GND. Since the common mode current outwardly radiates noise proportional to the current amplitude and the loop area in which the current flows, it will become difficult to conform to the EMC (Electro-Magnetic Compatibility) standards mainly because of the common mode current. On the other hand, in order to downsize the electric power converter, the heat sink occupying the main part of the volume of the converter needs to be made small.

For this purpose, according to the present invention, a plurality of insulating members, an AC electrode pattern, a P electrode pattern, and an N electrode pattern are layered and connected to a heat sink. With this configuration, the amplitude of the common mode current can be reduced, and the noise radiation can be reduced by making a cooling path small without making the size of the heat sink large.

Figure 1:
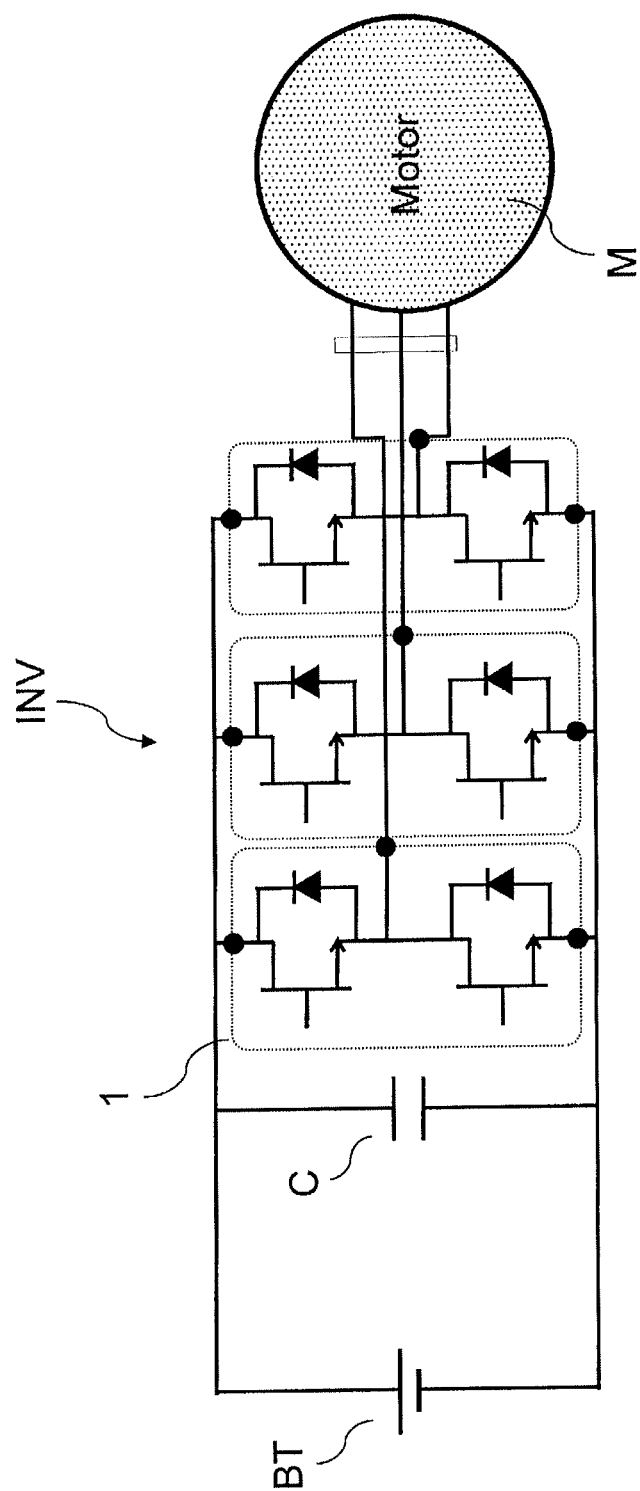
FIG. 1 is an electric circuit diagram that shows an example of an inverter circuit to which a semiconductor module according to an embodiment of the present invention is applied.

Hereinafter, a first embodiment of the present invention will be explained with reference to the drawings. FIG. 1 shows a three-phase inverter circuit as an example of a system to which a semiconductor module according to an embodiment of the present invention is applied. The semiconductor module 1 of this example is a 2 in 1 module that has a voltage switching mechanism of one phase. The specific configuration explained below is illustrated as a 2 in 1 module. However, the semiconductor module according to the present invention may be a semiconductor module in which functions of a plurality of phases are integrated.

In an electric power conversion system shown in FIG. 1, a first electric power such as a supply battery BT is converted into a second electric power by a smoothing capacitor C and an electric power conversion apparatus INV. This electric power is supplied to a three-phase AC motor M, or regenerative electric power of the three-phase AC motor M is converted into first electric power by the electric power conversion apparatus INV and the smoothing capacitor C so as to charge the supply battery BT.

First, common mode current will be explained with reference to FIG. 2 that shows a semiconductor module 101 of a conventional configuration. A P-side semiconductor device 102 and an N-side semiconductor device 103 having a switching element and a rectifier element are constructed of elements such as a MOSFET (Metal-Oxide-Semiconductor Field-Effect Transistor), a JFET (Junction gate Field-Effect Transistor), a BJT (Bipolar Junction Transistor), an IGBT (Insulated Gate Bipolar Transistor), a diode, or the like.

These elements turn ON/OFF the power supply voltage in response to control signals, and generate alternating-current power. In such a case, an AC terminal section 107 changes from several V to the power supply voltage for a short period of time, and common mode current as shown by a dotted arrow line A flows through stray capacitance 104 between an AC electrode pattern and the GND due to the voltage change.

Also, when switching is transient, the voltage of a P terminal 108 also changes. Therefore, current flows through stray capacitance 105 between a P electrode pattern and the GND, and common mode current as shown by a dotted arrow line B flows. A similar phenomenon occurs in each phase of the semiconductor module, and common mode current flows through the high voltage system and the GND via the earth capacitance of a load (not shown in the drawing), the earth capacitance of an electric power supply (not shown in the drawing), stray capacitance 106 between an N electrode pattern and the GND, and the like, so as to radiate noise to the outside. The amplitude of the radiated noise is proportional to the amplitude of the common mode current and the loop area in which the common mode current flows.

First Embodiment

Figure 4:
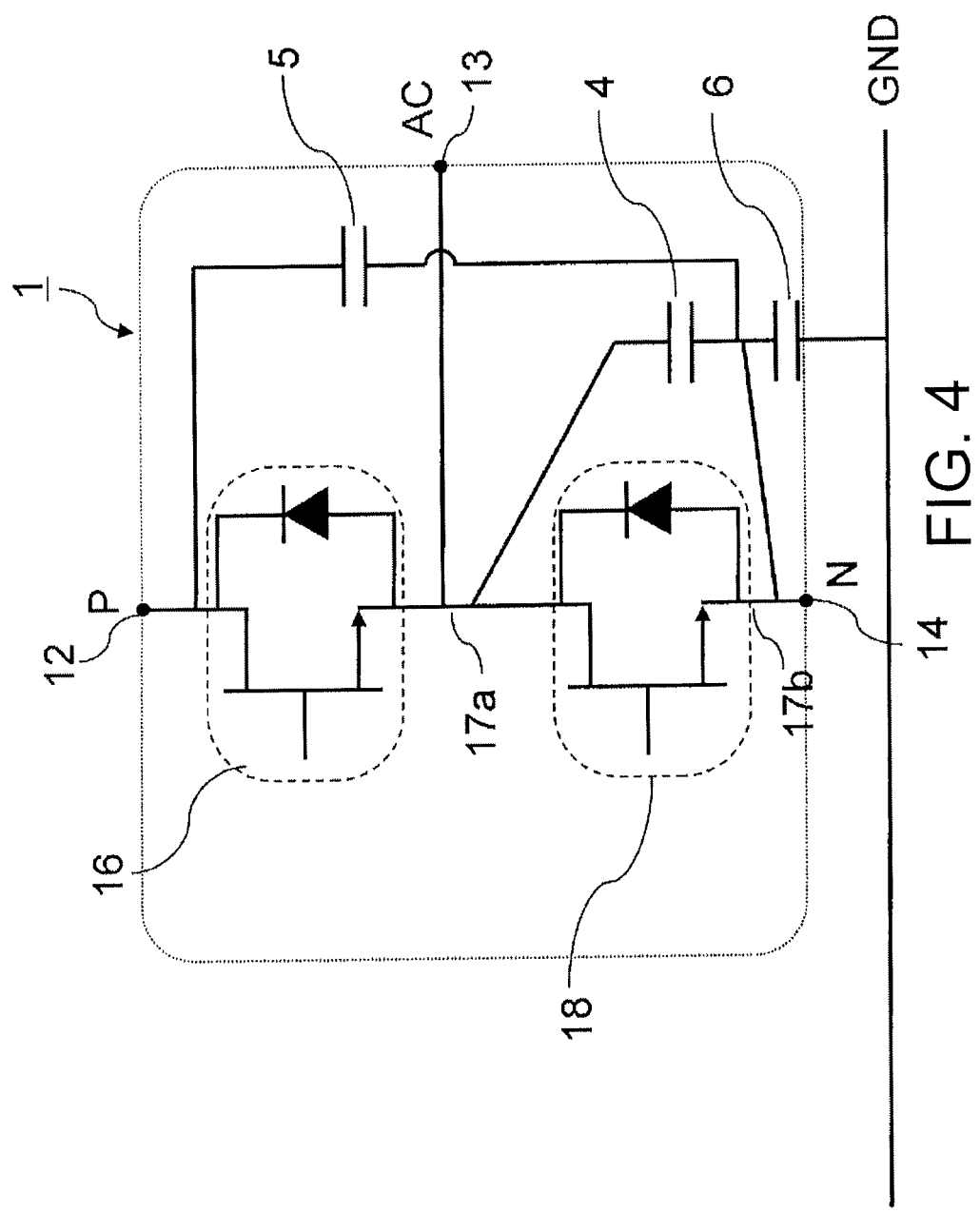
FIG. 4A is an electric circuit diagram for explaining the effect of the semiconductor module of FIG. 3A and FIG. 3B.

FIG. 4 is an electric circuit diagram that includes stray capacitance and shows the semiconductor module according to the first embodiment of the present invention. The semiconductor module 1 of this example has a P-side semiconductor device 16 and an N-side semiconductor device 18 constructed of a switching element and a rectifier element, respectively, and are provided with a heat sink 7, a P terminal 12 and an N terminal 14 are electrically connected to a first power system, and an AC terminal 13 is electrically connected to a second power system. Here, 4 refers to stray capacitance between an AC electrode pattern 11, to which the AC terminal 13 is connected, and the ground GND. 5 refers to stray capacitance between a P electrode pattern 10, to which the P terminal 12 is connected, and the ground GND. 6 refers to stray capacitance between an N electrode pattern 9, to which the N terminal 14 is connected, and the ground GND.

Figure 3A:
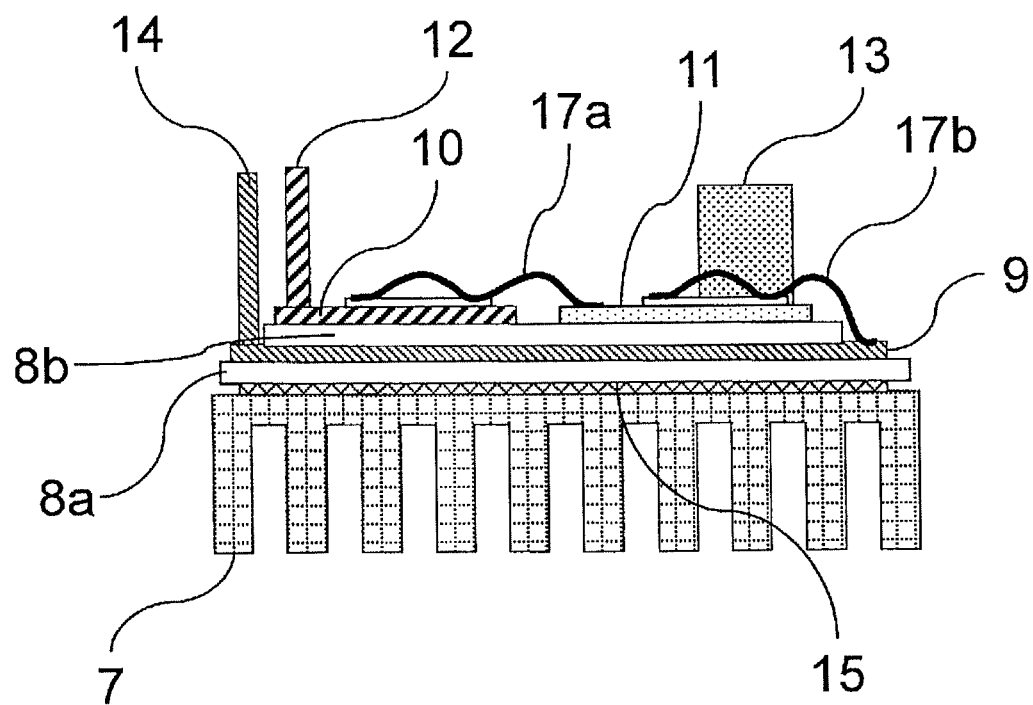
FIG. 3A is a side view a semiconductor module according to one embodiment of the present invention.
Figure 3B:
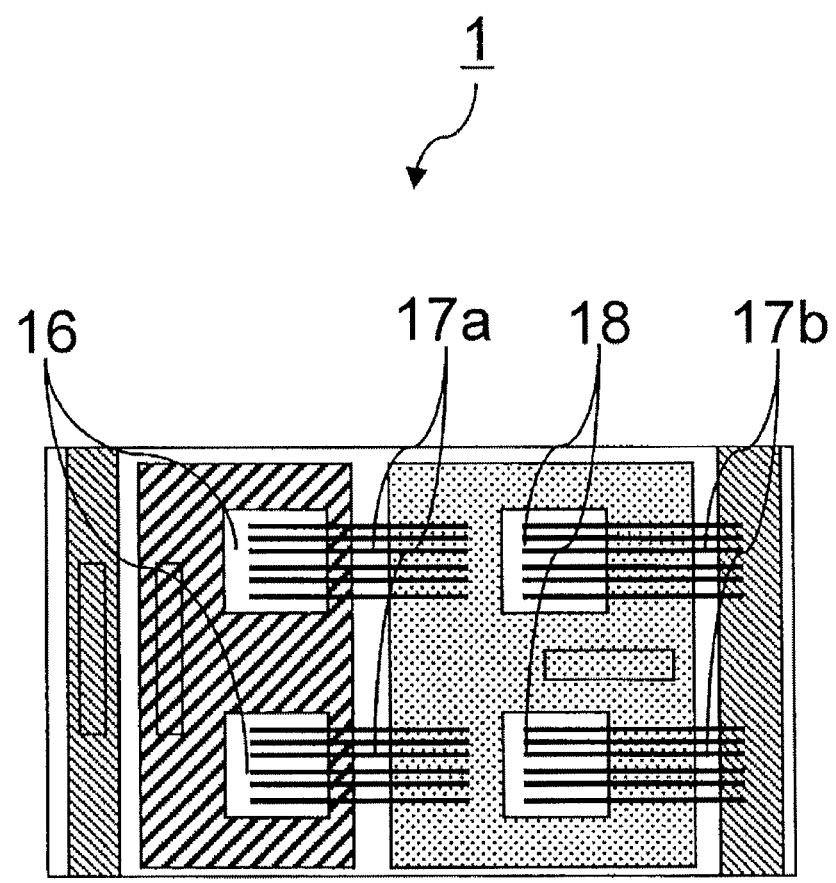
FIG. 3B is a plan view of the semiconductor module of FIG. 3A.

FIG. 3A is a side view and FIG. 3B is a plan view that show the semiconductor module according to the first embodiment shown in FIG. 4. The semiconductor module 1 of this example is provided with the heat sink 7 connected to the ground GND, the N electrode pattern 9 is connected onto the heat sink 7 via an insulating layer 8a, and the P electrode pattern 10 and the AC electrode pattern 11 are connected onto the N electrode pattern 9 via an insulating layer 8b. The P terminal 12 for inputting and outputting current is mounted to the P electrode pattern 10, the AC terminal 13 for inputting and outputting current is mounted to the AC electrode pattern 11, and the N terminal 14 for inputting and outputting current is mounted to the N electrode pattern 9.

Preferably, the electrode patterns 9, 10 and 11, and the insulating layers 8a and 8b are configured as a multi-layered ceramic substrate using silicon nitride. A metal pattern 15 for connection is provided in a surface that contacts the heat sink 7. The multi-layered ceramic substrate and the heat sink 7 are electrically and mechanically connected with each other by soldering or brazing.

An electrode formed in a lower surface of the P-side semiconductor device 16 is mounted to an upper surface of the P electrode pattern 10, shown in the drawing, so as to be electrically connected thereto. An electrode formed in an upper surface of the P-side semiconductor device 16 is electrically connected to the AC electrode pattern 11 by a bonding wire 17a or the like. Also, an electrode formed in a lower surface of the N-side semiconductor device 18 is mounted to an upper surface of the AC electrode pattern 11, shown in the drawing, so as to be electrically connected thereto. An electrode formed in an upper surface of the N-side semiconductor device 18 is electrically connected to the N electrode pattern 9 by a bonding wire 17b or the like.

Here, although it is not shown in the drawing, signal lines are connected to the switching elements of the P-side semiconductor device 16 and the N-side semiconductor device 18, and the signal lines output from a driving circuit are connected to electrodes to which the switching signals are input. Also, although it is not shown in the drawing, the multi-layered insulating substrate is enclosed by a case, which is sealed by an insulating material.

As described above, the N electrode pattern 9 is provided on the heat sink, that is connected to the ground, via the insulating layer 8a, and the P electrode pattern 10 and the AC electrode pattern 11 are provided on the N electrode pattern 9 via the insulating layer 8b. In this circuit configuration, therefore, the stray capacitance between the AC electrode pattern 11 and the ground GND that contributes to the magnitude of the common mode current shown in FIG. 4 is arranged such that the stray capacitance 4 between the AC electrode pattern 11 and the N electrode pattern 9 and the stray capacitance 6 between the N electrode pattern 9 and the ground GND are connected in series. Also, in this circuit configuration, the stray capacitance between the P electrode pattern 10 and the ground GND is arranged such that the stray capacitance 5 between the P electrode pattern 10 and the ground GND and the stray capacitance 6 between the N electrode pattern 9 and the ground GND are connected in series.

When two or more capacitors C1, C2 are connected, the total capacitance C of the capacitors is C=C1+C2+ . . . in a case of being connected in parallel, while the total capacitance C of the capacitors is C=1/C1+1/C2+ . . . in a case of being connected in series. Accordingly, the stray capacitance becomes small in a case of being connected in series. In the semiconductor module 1 of this example, therefore, the stray capacitance becomes small by being connected in series, and the common mode current represented by $I_{cm}=C\times(dV/dt)$ also becomes small.

On the other hand, in terms of cooling, while the insulating layer 8b has one more layer in this example, the P electrode pattern 10 and the N electrode pattern 9, and the AC electrode pattern 11 and the N electrode pattern 9 are connected with low resistance, respectively. Therefore, the deterioration in the cooling performance is extremely small.

Further, as shown in FIG. 3, since the current pathway from the P terminal 12 to the N terminal 14 via the AC electrode pattern 11 has an opposed configuration, the inductance is low between the P terminal 12 and the N terminal 14. Therefore, the voltage change of the P terminal 12 when switching is transient can be controlled.

Incidentally, as shown in FIG. 5, in the N electrode pattern 9, a through hole 19 may be provided in the insulating layer 8b located on the upper side of the multi-layered ceramic substrate and a part of the N electrode pattern 9 may be disposed on the upper surface of the insulating layer 8b so as to facilitate removal of the N terminal 14 and connection to the N-side semiconductor device 18.

Second Embodiment

Figure 6A:
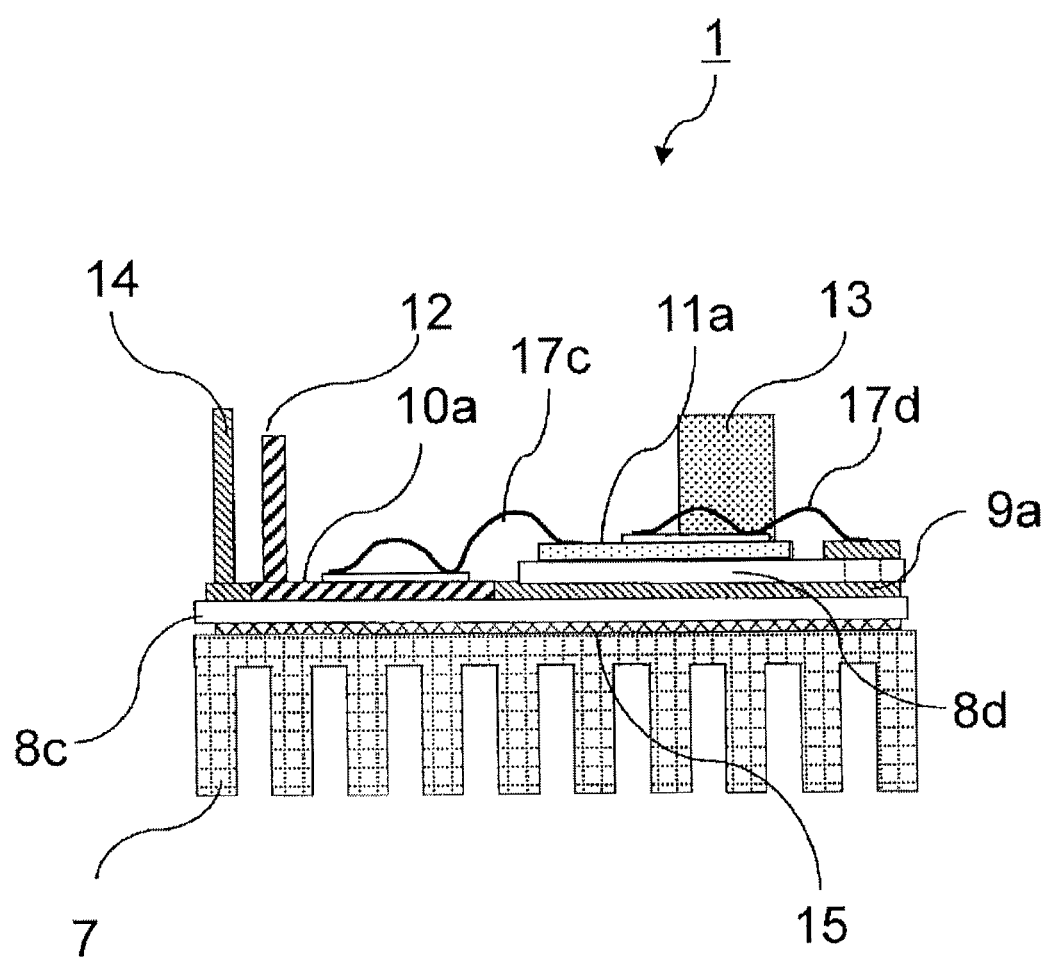
FIG. 6A is a side view that shows a semiconductor module according to another embodiment of the present invention.
Figure 6B:
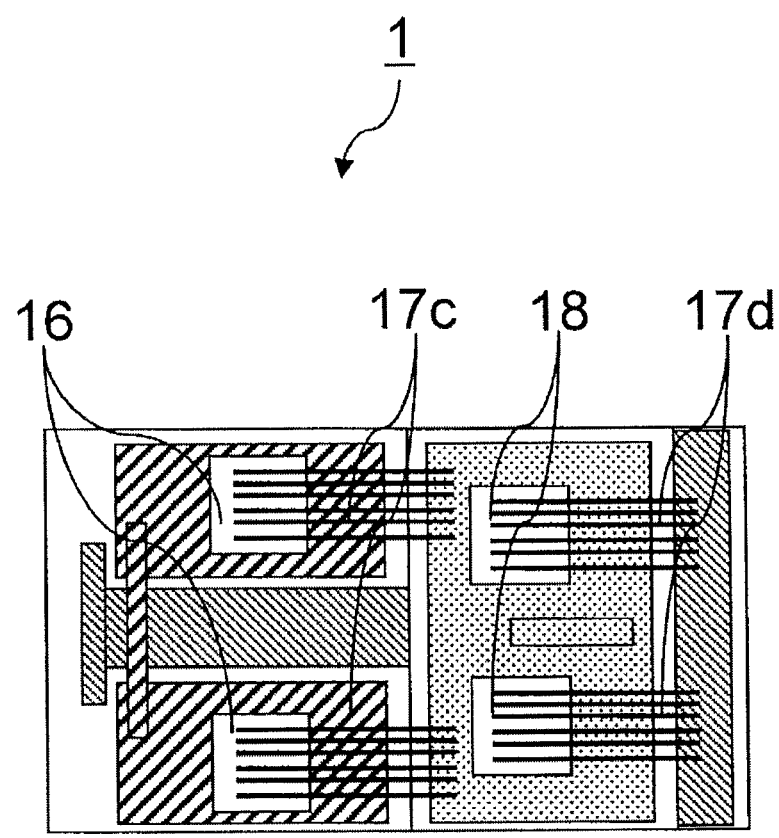
FIG. 6B is a plan view of FIG. 6A.

FIG. 6A is a side view and FIG. 6B is a plan view that show the semiconductor module according to the second embodiment. The semiconductor module 1 of this example is provided with the heat sink 7 connected to the ground GND. An N electrode pattern 9a and a P electrode pattern 10a are connected onto the heat sink 7 via an insulating layer 8c, and an AC electrode pattern 11a is connected onto the N electrode pattern 9a via an insulating layer 8d. The P terminal 12 for inputting and outputting current is mounted to the P electrode pattern 10a, the AC terminal 13 for inputting and outputting current is mounted to the AC electrode pattern 11a, and the N terminal 14 for inputting and outputting current is mounted to the N electrode pattern 9a. Compared to the semiconductor module 1 of the first embodiment shown in FIG. 3A and FIG. 3B, the position of layering the P electrode pattern 10, 10a is different.

Preferably, the electrode patterns 9a, 10a and 11a, and the insulating layers 8c and 8d are configured as a multi-layered ceramic substrate using silicon nitride. The metal pattern 15 for connection is provided in a surface that contacts the heat sink 7. The multi-layered ceramic substrate and the heat sink 7 are electrically and mechanically connected with each other by soldering or brazing.

An electrode formed in a lower surface of the P-side semiconductor device 16 is mounted to an upper surface of the P electrode pattern 10a, shown in the drawing, so as to be electrically connected thereto. An electrode formed in an upper surface of the P-side semiconductor device 16 is electrically connected to the AC electrode pattern 11a by a bonding wire 17c or the like. Also, an electrode formed in a lower surface of the N-side semiconductor device 18 is mounted to an upper surface of the AC electrode pattern 11a, shown in the drawing, so as to be electrically connected thereto. An electrode formed in an upper surface of the N-side semiconductor device 18 is electrically connected to the N electrode pattern 9a by a bonding wire 17d or the like.

Here, although it is not shown in the drawing, signal lines are connected to the switching elements of the P-side semiconductor device 16 and the N-side semiconductor device 18, and the signal lines output from a driving circuit are connected to electrodes to which the switching signals are input. Also, although it is not shown in the drawing, the multi-layered insulating substrate is enclosed by a case, which is sealed by an insulating material.

In particular, in the semiconductor module 1 of this example, the area of the P electrode pattern 10a and the area of the N electrode pattern 9a in the planar view of FIG. 6B are configured to be identical or substantially identical. A portion in which the N electrode pattern 9a is not located below the AC electrode pattern 11a is filled with a ceramic material similar to the insulating layer 8c.

Figure 7:
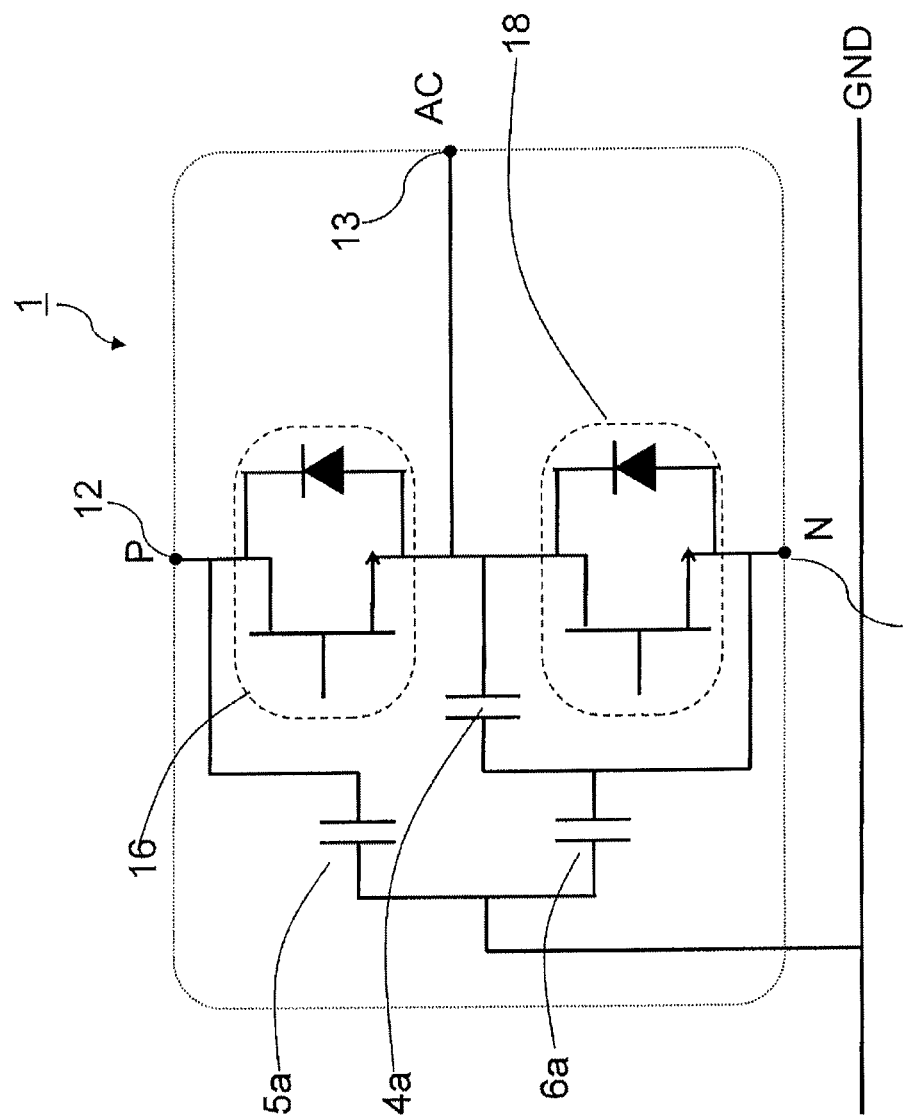
FIG. 7 is an electric circuit diagram for explaining the effect of the semiconductor module of FIG. 6A and FIG. 6B.

With the configuration described above, in the electric circuit shown in FIG. 7, although stray capacitance 5a between the P electrode pattern 10a and the ground GND becomes large compared to the first embodiment, stray capacitance 6a between the N electrode pattern 9a and the ground GND becomes small compared to the first embodiment and becomes similar to the stray capacitance 5a between the P electrode pattern 10a and the ground GND. Therefore, common mode current generating in the semiconductor module of a phase (each phase of U, V, and W) does not flow toward the supply battery BT or the motor M, so that the common mode current can be circulated into the stray capacitance in the adjacent semiconductor module of another phase. As a result of this, the loop area of the common mode current can be made small.

Further, since the stray capacitance 6a between the N electrode pattern 9a and the ground GND becomes small, the combined series capacitance with the stray capacitance 4a between the AC electrode pattern 11a and the N electrode pattern 9a, that is the stray capacitance between the AC electrode pattern 11a and the ground GND (the total capacitance of the stray capacitance 4a and the stray capacitance 6a), also becomes small. Accordingly, the noise radiation is reduced.

As described above, in the semiconductor module 1 of the first embodiment and the second embodiment, the AC electrode pattern 11, 11a that will cause leakage current to the ground GND is grounded via the N electrode pattern 9, 9a. Therefore, the capacitance with respect to the GND of the AC electrode pattern 11, 11a becomes small, which can reduce the common mode current.

Further, in the semiconductor module 1 of the first embodiment, the P electrode pattern 10, 10a that will cause leakage current next to the AC electrode pattern 11, 11a is grounded via the N electrode pattern 9, 9a. Therefore, the capacitance with respect to the GND of the P electrode pattern 10, 10a becomes small and the inductance between the PN terminals decreases. Consequently, the voltage change in the P electrode pattern 10, 10a when switching is transient can be controlled, and thus the common mode current can be controlled.

Also, according to the semiconductor module 1 of the second embodiment, since the capacitance with respect to the GND of the P electrode pattern 10a and the capacitance with respect to the GND of the N electrode pattern 9a become similar, the common mode current will be circulated between the adjacent semiconductor modules. As a result of this, the loop area becomes small and the noise radiation can be controlled.

Figure 5A:
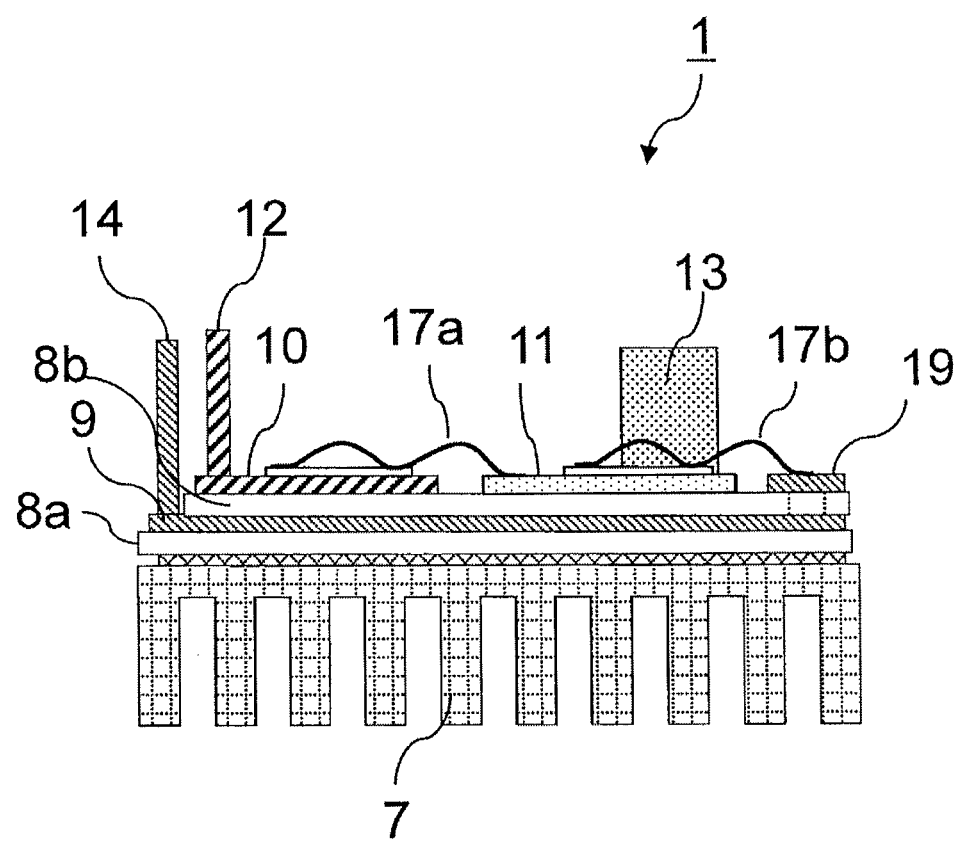
FIG. 5A is a side view of a semiconductor module that is a modified example of the semiconductor module of FIG. 3A and FIG. 3B.
Figure 5B:
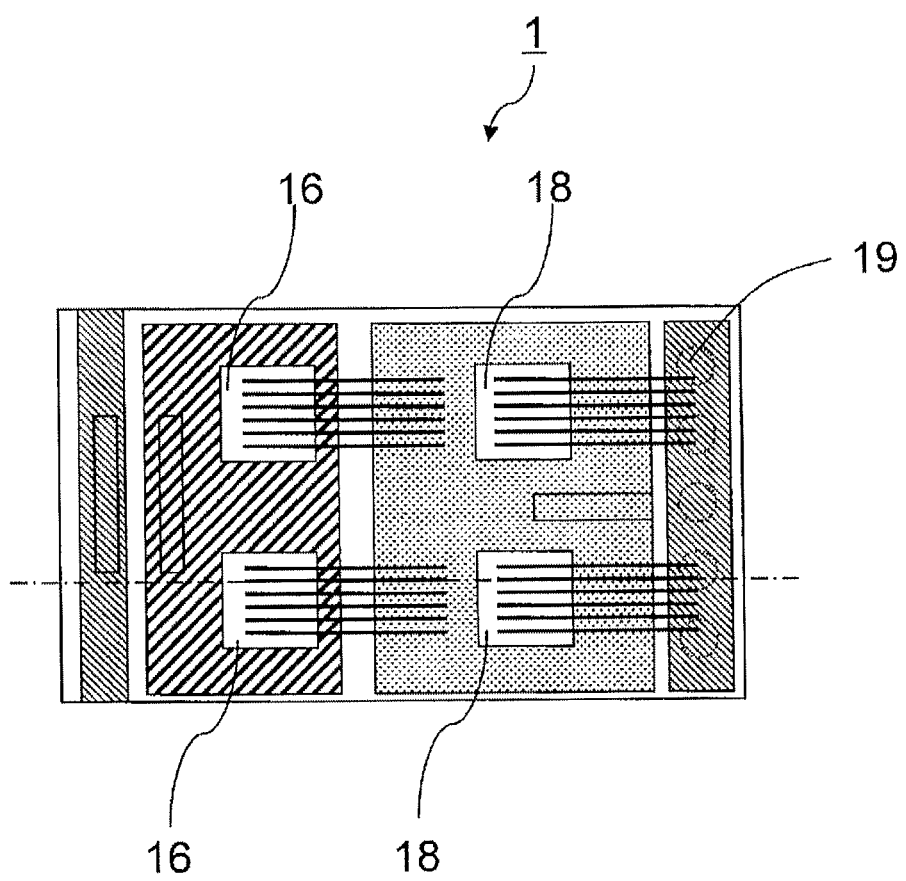
FIG. 5B is a plan view of the semiconductor module of FIG. 5A.

Further, according to the semiconductor module 1 shown in FIG. 5A and FIG. 5B, the connection areas (overlapping areas in a layering direction) between each of the P electrode pattern 10 and the AC electrode pattern 11, and the N electrode pattern 9 become large. Therefore, the inductance is reduced, and the thermal resistance from the P electrode pattern 10 to the heat sink 7 and from the AC electrode pattern 11 to the heat sink 7 becomes small. Consequently, the heat sink 7 can be downsized.

Here, in the above-described embodiments, the electric power conversion apparatus is explained taking an inverter in which so-called direct-alternating conversion is conducted as an example. However, a similar effect can be achieved by direct-direct conversion (DC-DC conversion), for example.

The above-described supply battery BT corresponds to the first power system according to the present invention. The above-described P terminal 12 and N terminal 14 correspond to the first terminal according to the present invention. The above-described motor M corresponds to the second power system according to the present invention. The above-described AC terminal 13 corresponds to the second terminal according to the present invention. The above-described P electrode pattern 10, 10a corresponds to the first electrode according to the present invention. The above-described N electrode pattern 9, 9a corresponds to the second electrode according to the present invention. The above-described AC electrode pattern 11, 11*a* corresponds to the output electrode according to the present invention. The above-described insulating layer 8*a*, 8*c* corresponds to the first insulating member according to the present invention. The above-described insulating layer 8*b*, 8*d* corresponds to the second insulating member according to the present invention.

The invention claimed is:

1. A semiconductor module comprising:
    a first terminal having two terminal sections electrically connected to a first power system, and a second terminal electrically connected to a second power system;
    a first semiconductor device having a first electrode section and a second electrode section;
    a second semiconductor device having a first electrode section and a second electrode section, the second semiconductor device being connected in series with the first semiconductor device;
    a heat sink;
    a first electrode electrically connected between one of the two terminal sections of the first terminal and to the first electrode section of the first semiconductor device;
    an output electrode electrically connected to the second terminal, the second electrode section of the first semiconductor device, and the first electrode section of the second semiconductor device; and
    a second electrode electrically connected between the other of the two terminal sections of the first terminal and the second electrode section of the second semiconductor device,
    the second electrode overlying a first side of a first insulating member, a second insulating member overlying the second electrode on a side opposite to the first insulating member, and the output electrode overlying the second insulating member on a side opposite to the second electrode and a second side of the first insulating member overlying the heat sink.

2. The semiconductor module according to claim 1, wherein
    the first electrode is connected to the second electrode via the second insulating member.

3. The semiconductor module according to claim 1, wherein
    the first electrode is connected to the heat sink via the first insulating member, and
    an area of the first electrode and an area of the second electrode are substantially identical.

4. The semiconductor module according to claim 1, wherein
    the second electrode includes
        an electrode formed on the same surface as the output electrode,
        an electrode formed on the first insulating member, and
        a through hole that connects these two electrodes.

5. The semiconductor module according to claim 2, wherein the second electrode includes
    an electrode formed on the same surface as the output electrode,
    an electrode formed on the first insulating member, and
    a through hole that connects these two electrodes.

6. The semiconductor module according to claim 3, wherein the second electrode includes
    an electrode formed on the same surface as the output electrode,
    an electrode formed on the first insulating member, and
    a through hole that connects these two electrodes.

* * * * *